United States Patent [19]

Makimoto

[11] 3,735,481

[45] May 29, 1973

[54] METHOD OF MANUFACTURING AN INTEGRATED CIRCUIT HAVING A TRANSISTOR ISOLATED BY THE COLLECTOR REGION

[75] Inventor: Tsugio Makimoto, Kodaira-shi, Japan

[73] Assignee: Hitachi, Ltd., Tokyo, Japan

[22] Filed: Feb. 25, 1971

[21] Appl. No.: 118,615

Related U.S. Application Data

[60] Division of Ser. No. 4,468, Jan. 19, 1970, Pat. No. 3,596,149, Continuation of Ser. No. 752,049, Aug. 12, 1968, abandoned.

[52] U.S. Cl. ........................29/578, 29/576, 148/175

[51] Int. Cl. ..............................................B01j 17/00

[58] Field of Search...............................29/578, 576; 148/175; 317/235

[56] References Cited

UNITED STATES PATENTS

| | | | |
|---|---|---|---|
| 3,038,087 | 6/1962 | Luscher | 317/235 |
| 3,293,087 | 12/1966 | Porter | 317/235 |
| 3,442,723 | 5/1969 | Wakamiya | 317/235 |
| 3,450,959 | 6/1969 | Dale | 317/235 |

*Primary Examiner*—Charles W. Lanham
*Assistant Examiner*—Wilbur C. Tupman
*Attorney*—Craig, Antonelli, Stewart & Hill

[57] ABSTRACT

A method of manufacturing a semiconductor integrated circuit in which a P type semiconductor layer is epitaxially grown in the surface of a P type semiconductor substrate containing $N^+$ buried layers therein, the P type layer is divided into a plurality of electrically isolated portions by $N^+$ type regions which are formed by diffusing a donor impurity into the surface of said P type semiconductor layer towards the $N^+$ type buried layers, the divided P type semiconductor portions forming individually diodes and transistors with the $N^+$ type regions connected to said buried layers as their structural elements.

7 Claims, 8 Drawing Figures

PATENTED MAY 29 1973 3,735,481

SHEET 1 OF 2

INVENTOR

TSUGIO MAKIMOTO

BY Craig, Antonelli, Stewart & Hill

ATTORNEYS

INVENTOR

TSUGIO MAKIMOTO

BY Craig, Antonelli, Stewart & Hill

ATTORNEYS

METHOD OF MANUFACTURING AN INTEGRATED CIRCUIT HAVING A TRANSISTOR ISOLATED BY THE COLLECTOR REGION

CROSS-REFERENCES TO RELATED APPLICATION

This application is a DIvisional application of our earlier copending U.S. Ser. No. 4,468 filed Jan. 19, 1970, now U.S. Pat. No. 3,596,149 which is a Streamlined Continuation application of U.S. Ser. No. 752049 filed Aug. 12, 1968, now abandoned.

BACKGROUND OF THE INVENTION

1. Filed of the Invention

This invention relates to a method of manufacturing a semiconductor integrated circuit and more particularly to an improvement of a method of manufacturing a saturated type logical circuit comprising diodes and transistors.

2. Description of the Prior Art

Recently with the development of high-speed electric computers, high-speed switching elements or circuits have been desired and proposed. For example, as a proposal to speed up the function of a logical circuit consisting of PN junction diodes and bipolar transistors the transistors are operated under non-saturated conditions. However, it is a very difficult problem to realize a high-speed saturated type logical circuit by extending the action of the transistors to the saturation region because of the storage effect of the so-called minority carrier. As a solution to this problem it is proposed to introduce a certain kind of metal, e.g., fold, having the effect of reducing the lifetime of the carrier into the collector and base regions.

Such a method, however, encounters a difficulty in integrating the high-speed logical circuit, as it is not simple in the present technique to diffuse the life-time killer such as gold into a selected portion. In particular, in the case of a D.T.L. circuit or a logical circuit comprising diodes and transistors the requirements are that one or more level shift diodes connected to the bases of transistors have a large carrier storage effect while a plurality of gating diodes connected to these level shift diodes have a small one as the gating diodes as well as the switching transistors need a rapid recovery action. Therefore, when the D.T.L. circuit is integrated in a semiconductor substrate, it is difficult to diffuse gold having a high diffusion speed selectively to some of the diodes and transistors which are positioned adjacent to one another and have opposite characteristics.

SUMMARY OF THE INVENTION

One object of this invention is to provide a method of manufacturing a semiconductor integrated circuit comprising switching elements, particularly transistors, having a reduced minority carrier storage effect.

Another object of this invention is to provide a method of manufacturing a semiconductor integrated circuit comprising diodes and/or transistors with a reduced minority carrier storage effect and switching elements with a suitably increased one, thus improving the switching characteristic.

A further object of this invention is to provide a method of manufacturing a semiconductor integrated circuit comprising transistors having a small collector saturation resistance and collector capacitance through the use of the advanced isolation technique, thereby increasing the integration density of the elements.

Still another object of this invention is to provide a simple industrial method for manufacturing a semiconductor integrated circuit fulfilling the abovementioned objects through the use of the epitaxial growth technique.

According to one embodiment of this invention a semiconductor integrated circuit is provided as follows. A first conductivity type semiconductor layer having a relatively low surface impurity concentration is epitaxially grown on the surface of a first conductivity type semiconductor substrate having a plurality of second conductivity type buried layers in one principal surface thereof. The first conductivity type semiconductor layer is divided into a plurality of electrically isolated portions by second conductivity type regions which are formed by diffusing a second conductivity type determining impurity in a closed ring shape into the surface of the first conductivity type semiconductor layer towards the buried layers. The divided plural portions constitute individual switching elements such as diodes and transistors, the buried layers and the second conductivity type impurity diffused regions serving as their structural elements.

In the above constitution, transistors are formed in the following manner. The first conductivity type highly doped region is selectively formed in one portion (first isolated region) of the epitaxially grown layer surrounded with the buried layers and the second conductivity type impurity diffused regions. Second conductivity type highly doped regions are selectively formed as the emitter regions in the first highly doped region. The buried layers and the second conductivity type impurity diffused regions connected therewith are utilized as collector regions. The first conductivity type highly doped regions and the epitaxially grown layers having a relatively low surface impurity concentration serve as the base regions with a gradient of impurity concentration. The width of the base regions is defined less than the diffusion length of the minority carrier existing therein.

The diodes making the high-speed recovery action are obtained simultaneously in the same manner by fitting one electrode to the emitter regions of different transistors formed in the second isolated regions and the other electrode to their base-collector junctions.

The diodes having a large carrier storage effect are obtained as follows. Second conductivity type highly doped regions are formed in the third isolated regions simultaneously with the formation of the emitter regions of the above transistors thereby to constitute still other transistors not having the first conductivity type highly doped regions. A pair of electrodes are fitted to the collector regions and the emitter-base junctions of the individual transistors thus obtained.

The fourth isolated region is used as a resistor by forming a pair of electrodes in two different portions thereon.

A concrete embodiment of this invention will be described hereinafter as to the technique of constituting a D.T.L. circuit by preparing the necessary number of the above-mentioned diodes, transistors and resistors.

The above and other objects and features of this invention will be made more apparent by the following explanation of the preferred embodiment of this invention taken in conjunction with the accompanying drawings.

BRIEF DESCRIPTION OF THE DRAWINGS

FIGS. 4*a* to 4*e* are cross-sectional views showing a semiconductor integrated circuit manufactured by the method according to this invention integrating the circuit configuration as shown in FIG. 1.

DESCRIPTION OF THE PREFERRED EMBODIMENTS

Figure 1:
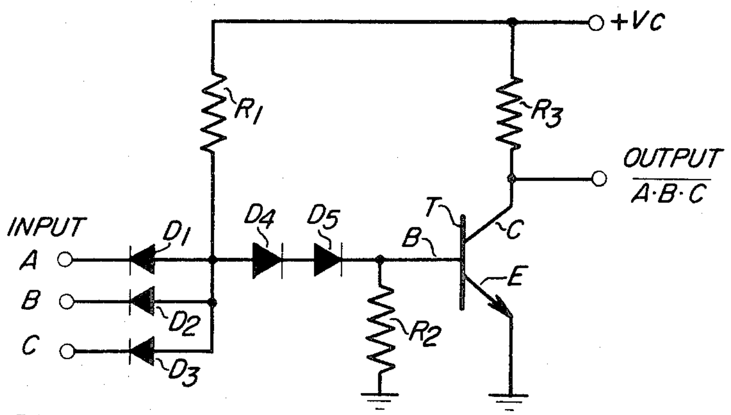
FIG. 1 shows a circuit diagram showing an NAND circuit as a typical D.T.L. circuit integrated in one semiconductor body.
Figure 2:
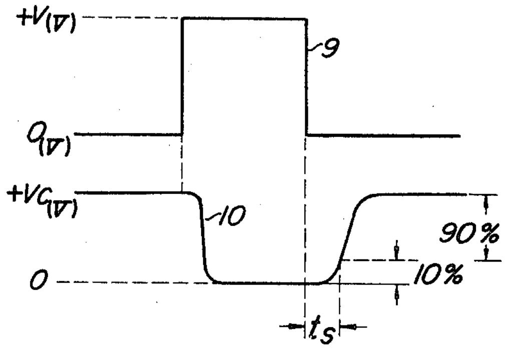
FIG. 2 shows wave-forms drawn for explaining this invention.

A typical example of the saturated type logical circuit as shown in FIG. 1 is a diode-transistor-logical circuit. In FIG. 2 showing the input and output wave-forms, it is seen that the output wave 10 lags behind the input wave form 9 and is distorted. This invention aims in particular at improving the decrease of minority carrier storage time ($t_s$).

Figure 3:
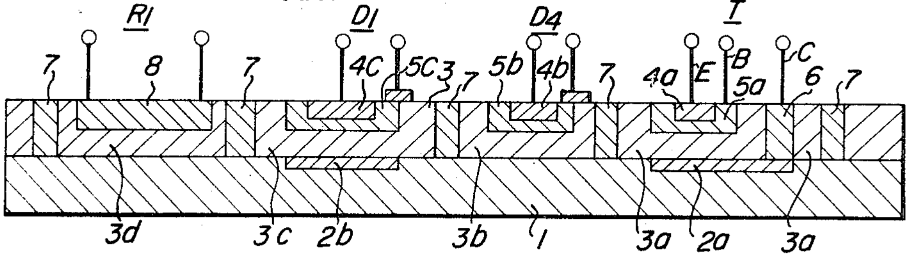
FIG. 3 PRIOR ART
FIG. 3 is a cross-sectional view showing an example of a prior art semiconductor circuit integrating the circuit configuration as shown in FIG. 1.

FIG. 3 shows a prior art semiconductor circuit integrating the NAND circuit shown in FIG. 1. In this figure like reference numerals are used to denote parts similar to those shown in FIG. 1. T is an inverter transistor region, $D_4$ is a level shift diode region, and $D_1$ is a gate diode region. The member 1 is a P type semiconductor substrate, and 2*a* and 2*b* are $N^+$ type layers, usually called buried layers, formed by diffusing an impurity selectively into some portions of the substrate. The layers 3*a* to 3*d* are N type epitaxial layers formed on the substrate 1, isolated from one another by $P^+$ type isolation regions 7 which are heavily doped with an acceptor impurity. The $P^+$ type regions 7 are formed in the following manner. First $P^+$ layers are partially formed in the surface of the substrate 1 in advance as the first diffusion sources. After the formation of the epitaxial layers an acceptor impurity is diffused from the first diffusion sources into the epitaxial layers. At the same time another acceptor impurity is also diffused from the second diffusion sources into the surface of the epitaxial layers so as to be in registration with the first diffusion sources. The regions 4*a* to 4*c* and 5*a* to 5 *c* are emitter and base regions respectively. The region 6 is a diffused $N^+$ type high impurity concentration region having the same conductivity type as that of the collector regions. This region is provided to decrease the collector series resistance at the collector terminals. The formation is performed in the same manner as that of the above isolation regions 7 except that the impurity used is donor. Diodes $D_1$ and $D_4$ are constituted so that the emitter region forms one electrode while the base and collector regions are short-circuited to form the other electrode. $R_1$ is a resistor consisting of a P type resistor channel 8 and a pair of electrodes fitted to both ends of the channel 8. The P type resistor channel 8 is formed by diffusing an acceptor impurity in the isolated region 3*d*.

The above-mentioned minority carrier storage time depends on the charges stored in the inverter transistor T. It is generally practiced to diffuse gold in the transistor T to decrease the lifetime and hence the number of the storage minority carriers. However, the application of such a method to the integrated circuit is extremely difficult due to the following reasons.

1. Since the above semiconductor integrated circuit constitutes its whole circuit network in an extremely small semiconductor piece, the gate diode, the transistor, and the level shift diode regions are located adjacent to one another. Therefore, it is a very difficult task to diffuse gold having high diffusion speed selectively in the transistor region and the gate diode region only.

2. When gold is diffused in the level shift diode region $D_4$, the charge storage in this diode becomes extremely small. Therefore, it becomes impossible to utilize the charge storage phenomenon of this diode and to Set the base potential of transistor T at zero or a reverse bias.

3. If the level shift diode region is separated at a distance from the inverter transistor and the diode regions sufficient to prevent the diffusion of gold to the level shift diode, the degree of integration per unit area decreases.

Next, an embodiment of this invention will be explained in detail with reference to FIGS. 4*a* to 4*e*.

FIG. 4*e* shows a cross-section of a semiconductor integrated circuit comprising a transistor To, diodes D*a* and D*b*, and a resistor R*o* in a semiconductor body. The first conductivity type semiconductor substrate 11 has second conductivity type diffused regions 12 to 15 in one principal surface thereof. An epitaxially grown semiconductor layer 16 of the first conductivity type having a relatively low impurity concentration is formed on the above principal surface to cover the second conductivity type regions 12 to 15. The semiconductor layer 16 is divided into a plurality of epitaxial semiconductor regions 22 to 25 lying on the second conductivity regions 12 to 15 respectively and electrically isolated from one another by the second conductivity type diffused regions 18 to 21. Since the epitaxial semiconductor regions 22 to 25 are grown simultaneously with the semiconductor layer 16, their impurity concentrations and widths are nearly equal to those of the semiconductor layer 16. First conductivity type regions 26 and 27 having a nearly equal impurity concentration and depth are formed in the surface of the epitaxial semiconductor regions 22 and 24 respectively. Second conductivity type diffused regions 28 to 31 having a nearly equal surface impurity concentration and depth are formed in the surface of the first conductivity type regions 26 and 27 and the epitaxial semiconductor regions 23 and 25 respectively. Conducting layers 32 to 34 serve as the collector, base and emitter electrodes of the high-speed switching transistor T*o* respectively. Conducting layers 35 and 36 form a pair of electrodes of the diode D*a* having a large carrier storage effect, the electrode 36 short-circuiting the regions 23 and 29. The conducting layer 38 formed on the diffused region 30 and the conducting layer 37 short-circuiting the regions 20, 24 and 27 form a pair of electrodes for the high-speed switching diode D*b* having a small carrier storage effect. The first conductivity type epitaxial region 25 forms a resistor channel whose resistance is defined by the second conductivity type regions 15, 21 and 31. Electrodes 39 and 40 are fitted to both ends of the region 25. It is preferable that the regions 12 to 15, 18 to 21 and 28 to 31 of the second conductivity type have a relatively high surface impurity concentration, e.g., about $5 \times 10^{19}$ to $2 \times 10^{21}$ atoms/cm$^3$. The surface of the semiconductor body is covered with an insulating film 17 such as silicon dioxide to be protected from the external atmosphere.

In the above integrated circuit thus constructed, the transistor To has the $N^+P^+P^-N^+$ or $P^+N^+N^-P^+$ structure (the expression shows the order of junction structure from the emitter to collector sides). The fact that the collector 12 of the transistor To is a high impurity concentration region has an advantage, namely that the carrier storage in the collector region 12 under the saturated condition is negligibly small. Furthermore, the transistor T*o* has a small saturated resistance and collector barrier capacitance. The first conductivity type highly doped region 26 gives a large gradient of concentration to the base region. Thus the switching characteristic of transistor T*o* becomes satisfactory both in the on and off state. The danger that the minority carriers might be stored more in the $P^-$ type high resistivity region 22 in the base region of an $N^+P^+P^-N^+$-type transistor is out of question because the thickness of the $P^-$ type region 22 is made sufficiently small, for example, smaller than 0.5 $\mu$. In a conventional epitaxial transistor ($N^+PN^-N^+$ structure) the $N^-$ type collector region has a relatively large width, about 2 $\mu$, and hence has a large carrier storage effect. For example, the recovery time of the conventional epitaxial transistor is typically about 25 *n* sec while that of the transistor without this $N^-$ type collector layer according to this invention can be about 15 *n* sec.

The PN junction diode D*b* in the above circuit consists of substantially two regions 27 and 30 having a high impurity concentration and a PN junction formed therebetween. Therefore, this diode has a small carrier storage effect and the recovery time is short.

The PN junction diode D*a* consists of the regions 19 and 13 having a high impurity concentration, the region 23 having a uniform distribution of low impurity concentration, and PN junctions formed between these regions. Therefore, the storage carrier becomes rich in the low impurity concentration region 23 and hence the diode has slow recovery time. The diode D*a*, if necessary, may have one electrode on the region 23 and the other electrode on the region 19 and 29 by short-circuiting them. The PN junction formed between the regions 23 and 29 may be utilized for the diode D*a*.

The resistor channel 25 in the resistor R*o* consists of an epitaxially grown semiconductor having a uniform distribution of impurity and relatively high resistivity. This structure is advantageous in that a relatively high resistance is realized simply in a small area. The current never concentrates on the surface because of the existence of the second conductivity type region.

It is apparent therefore that the application of the above-mentioned semiconductor integrated circuit to the NAND circuit shown in FIG. 1 yields an excellent integrated NAND circuit by preparing three diodes D*b* having rapid recovery time for the gate diodes $D_1$, $D_2$ and $D_3$, two diodes D*a* for the level shift diodes $D_4$ and $D_5$, a high speed switching transistor T*o* for the inverter transistor T, and three resistors R*o* for the resistors $R_1$, $R_2$ and $R_3$.

Next, the manufacturing method of an integrated NAND circuit having the circuit composition as shown in FIG. 1 according to this invention will be explained with reference to FIGS. 4*a* to 4*e*. For the sake of brevity, an explanation will be given of a typical resistor and diodes having different recovery speed because others can be similarly produced.

Figure 4A:
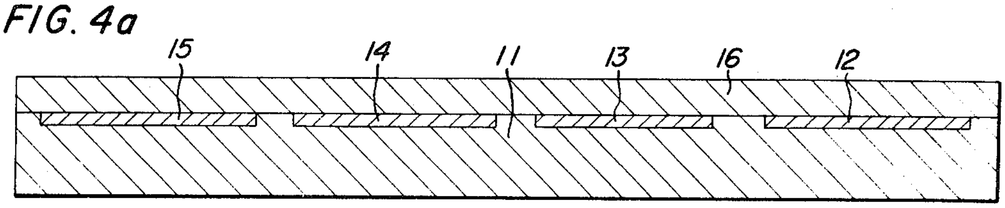

First as shown in FIG. 4*a*, a first conductivity type semiconductor substrate 11 of $P^-$ type silicon having resistivity of the order of 20 to 50 Ω cm is prepared. A first conductivity type high resistivity silicon layer 16 is epitaxially grown on one principal surface of the substrate. Preliminarily, four $N^+$ diffused regions 12 to 15, called buried layers, are formed in the surface of the $P^-$ type silicon substrate by diffusion antimony or arsenic. These diffused regions 12 to 15 have a high surface impurity concentration, e.g., $10^{20}$ atoms/cm$^3$. The epitaxial silicon layer 16 is doped lightly and uniformly with acceptor impurity to have a relatively high resistivity of the order of 0.5 Ω cm. Here $P^-$ means that the quantity of the doped impurity is little.

Figure 4B:
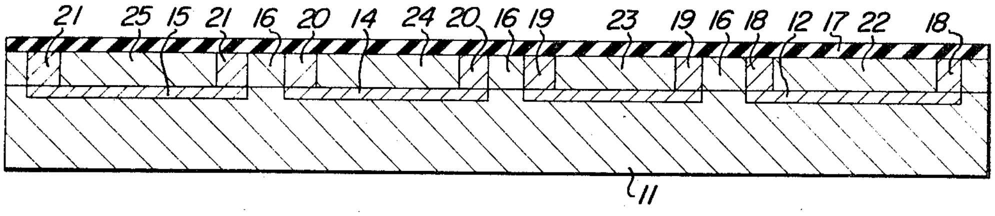

Next as shown in FIG. 4*b*, with an insulating film 17 such as silicon dioxide as a selective mask a donor impurity, e.g., phosphorus is selectively diffused in a closed ring shape into the epitaxial layer 16 to form $N^+$ type diffused regions 18 to 21 having a surface impurity concentration of about $10^{21}$ atoms/cm$^3$. In this step the epitaxial layer 16 is divided into plural portion 22 to 25, which are electrically isolated from one another and from both the $P^+$ type substrate 11 and the remaining portions of the epitaxial layer 16. The above isolation diffusion treatment is attained simply for a short time as the antimony or arsenic diffused from the buried layers 12 to 15 to the epitaxial layer 16 and the phosphorus introduced from the surface of the epitaxial layer can meet each other in epitaxial layer.

Figure 4C:
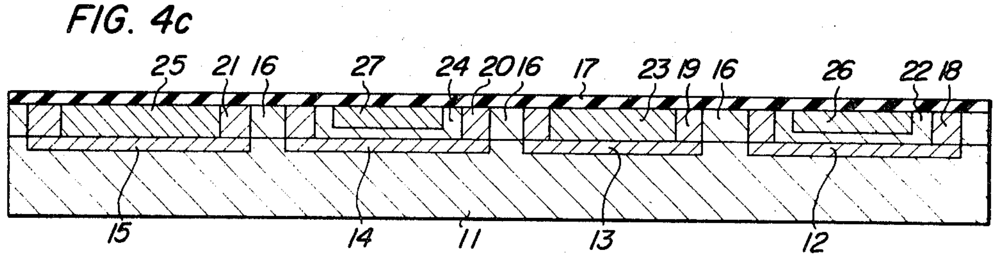

FIG. 4*c* shows the step of base diffusion. With the film 17 as the selective mask an acceptor impurity, e.g., boron is selectively diffused to form $P^+$ type diffused regions 26 and 27 having a relatively high surface impurity concentration of about $5 \times 10^{18}$ atoms/cm$^3$. These $P^+$ type regions 26 and 27 are not sufficiently deep to reach the buried layers 12 and 14 respectively, for example 1.8 $\mu$ thick.

Figure 4D:
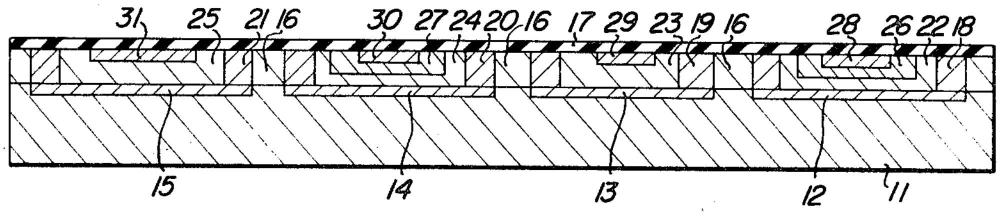
Figure 4D:
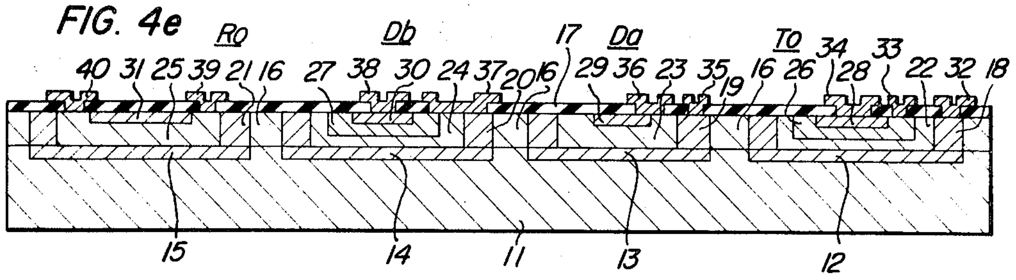

FIG. 4d shows the step of forming $N^+$ type diffused regions 28 to 31, the surface impurity concentration of which are as high as about $10^{21}$ atoms/cm$^3$. Their depths are defined about 1.5 $\mu$ so that the distances from these regions 28 to 31 to the buried layers 12 to 15 respectively are smaller than the diffusion length of electron carriers. The $N^+$ type regions 28, 29 and 30 have a large influence on the electrical characteristics of the transistors and diodes. The $N^+$ type regions 31 together with the $N^+$ type region 21 are important elements defining the resistance value of the resistor.

Finally as shown in FIG. 4*e*, using the conventional evaporation and photoetching techniques, electrodes made of, e.g., aluminum, are fitted to the predetermined portions as described above.

An integrated circuit made by the method according to this invention having the above-mentioned structure has the following effects.

1. Since the collector of the inverter transistor is constituted by a high impurity concentration region, the collector series resistance R*cs* can be made extremely low.

2. Since the collector region of the inverter transistor is heavily doped with an impurity, the charge storage at the collector and hence the storage time $t_s$ is negligibly small. Therefore, the circuit characteristics are remarkably improved.

3. Since the resistivity of the $P^-$ type epitaxial layer can be made higher than that of a prior art one, the collector capacitance $C_{ob}$ can be made small.

4. Since the resistivity of the $P^-$ type epitaxial layer and the $P^-$ type substrate may be selected high, the isolation capacitance can be made small.

5. Since the PN junction of the level shift diode is formed between the semiconductor layers with a high impurity concentration and with a uniform distribution of low impurity concentration, the minority carrier storage becomes large.

6. Since the donor impurity is phosphorus which has a relatively large diffusion coefficient and the epitaxial layer is made thinner than the conventional one, the isolation diffusion work can be simply done in a short time.

7. The isolation among the elements with the aid of the buried layers and the epitaxial layer is convenient when a plurality of circuit elements are to be formed in a single semiconductor body. So, the integration density of elements can be increased.

Although the above explanation of this invention has been given in respect to diode-transistor-logical circuit means, it is needless to say that the principle of this invention may be applied to other similar saturated type logical integrated circuit means such as resistance-transistor-logical (R.T.L. circuit) and transistor-transistor logical integrated circuit means (T.T.L. circuit).

I claim:

1. A method for manufacturing a semiconductor integrated circuit means having at least one transistor portion and two diode portions comprising the steps of:

preparing a semiconductor substrate of first conductivity type having one principal surface in which first, second and third regions of second conductivity type extend;

growing epitaxially a semiconductor layer of first conductivity type having a relatively low impurity concentration to cover said first to third regions of second conductivity type;

diffusing the impurity determining the second conductivity type around said first to third regions and forming fourth, fifth and sixth regions of second conductivity type like a closed ring from the surface of said semiconductor layer towards said first to third regions thereunder, thereby surrounding and electrically isolating first, second and third portions of said semiconductor layer of first conductivity type;

diffusing the impurity determining the first conductivity type and forming first and second regions of first conductivity type having a relatively high impurity concentration and substantially equal depth and surface impurity concentration in the surfaces of said first and second semiconductor portions;

diffusing the impurity determining the second conductivity type to form seventh, eighth and ninth regions of second conductivity type having substantially equal depth and surface impurity concentration in the surfaces of said first and second regions of first conductivity type and in the surface of said third semiconductor portion; and forming first and second electrodes on the surfaces of said seventh and eighth regions of second conductivity type, a third electrode on the surface of said first region of first conductivity type, a fourth electrode on said fourth region of second conductivity type, a fifth electrode short-circuiting said fifth region of second conductivity type surrounding said second portion and said second region of first conductivity type, and sixth and seventh electrodes respectively on said third semiconductor portion and said sixth region of second conductivity type surrounding it;

said first, third and fourth electrodes and respective semiconductor regions connected therewith constituting said transistor portion; said second and fifth electrode and the semiconductor regions connected therewith constituting said first diode portion; and said sixth and seventh electrodes with the corresponding semiconductor regions constituting said second diode portion.

2. A method for manufacturing a semiconductor integrated circuit means according to claim 1, in which a tenth region of second conductivity type extends in said principal surface of said substrate, comprising the steps of:

diffusing the impurity determining the second conductivity type to form said tenth region of said second conductivity type;

diffusing the impurity determining the second conductivity type around a fourth semiconductor portion and forming an eleventh region of said second conductivity type like a closed ring from the surface of said semiconductor layer toward said tenth region of said second conductivity type thereunder to surround and electrically isolate said fourth semiconductor portion of said first conductivity type on said tenth region; and forming eighth and ninth electrodes on two different portions of the surface of said fourth semiconductor portion surrounded with said eleventh region of second conductivity type, thereby constituting a resistor by said eighth and ninth electrodes and said fourth semiconductor portion connected therewith.

3. The method according to claim 1, in which a tenth region of the second conductivity type extends in said principal surface of said substrate, comprising the steps of:

diffusing an impurity determining the second conductivity type in a closed shape into the surface of said semiconductor layer under reaching said tenth region thereunder to form an eleventh region of the second conductivity type surrounding and electrically isolating a fourth semiconductor portion of the first conductivity type on said tenth region; and forming eighth and ninth electrodes on two different portions of the surface of said fourth semiconductor portion surrounded with said eleventh region, thereby constituting a resistor by eighth and ninth electrodes and said fourth semiconductor portion connected therewith.

4. A method of manufacturing an integrated circuit device including a transistor having an emitter, base and collector, comprising the steps of:

a. forming a first and a second region of a first conductivity type in a major surface of a semiconductor substrate of a second conductivity type;

b. forming an epitaxially grown semiconductor layer of the second conductivity type on said major surface of the substrate;

c. diffusing an impurity determining the first conductivity type into the epitaxially grown layer to form a third and a fourth region of the first conductivity type reaching said first and second regions respectively, separated from one another and isolating a first and a second portion of said epitaxially grown layer from the remaining portions thereof;

d. forming a fifth region of the first conductivity type in said first portion and spacing said fifth region from said first region with a distance shorter than the diffusion length of the minority carriers in said epitaxially grown layer of the second conductivity type by diffusing an impurity determining the first conductivity type in said first portion with a predetermined temperature and time sufficient to form, therein, said fifth region; and e. connecting an emitter, a base and a collector electrode to said fifth region, said first portion and said third region, respectively.

5. A method for manufacturing a semiconductor integrated circuit having at least one transistor portion and two diode portions comprising the steps of:

preparing a semiconductor substrate of a first conductivity type having one principal surface in which first, second and third regions of a second conductivity type extend;

growing epitaxially a semiconductor layer of the first conductivity type having a relatively low impurity concentration to cover said first, second and third regions;

diffusing an impurity determining the second conductivity type in a closed shape into said semiconductor layer on said first, second and third regions until reaching said first, second and third regions to form fourth, fifth and sixth regions of the second conductivity type surrounding and electrically isolating first, second and third portions of said semiconductor layer;

diffusing an impurity determining the first conductivity type to form seventh and eighth regions of the first conductivity type having a relatively high impurity concentration and substantially equal depth and surface impurity concentration in the surfaces of said first and second semiconductor portions;

diffusing an impurity determining the second conductivity type to form ninth, tenth and eleventh regions of the second conductivity type having substantially equal depth and surface impurity concentration in the surfaces of said seventh and eighth regions and in the surface of said third semiconductor portions; and forming first and second electrodes on the surfaces of said ninth and tenth regions, a third electrode on the surface of said seventh region, a fourth electrode on said fourth region, a fifth electrode short-circuiting said fifth region surrounding said second portion and said eighth region, and sixth and seventh electrodes on said third semiconductor portion and said sixth region surrounding said third semiconductor portion, respectively;

said first, third and fourth electrodes and respective semiconductor regions connected therewith constituting said transistor portion;

said second and fifth electrode and the semiconductor regions connected therewith constituting said first diode portions; and said sixth and seventh electrodes with the corresponding semiconductor regions constituting said second diode portion.

6. A method according to claim 4, wherein after the step (c) and before the step (d) the method further comprises a step of diffusing an impurity determining the second conductivity type in said first portion of said epitaxially grown layer to form a sixth region therein, and wherein in step (d) said fifth region is formed in said sixth region and more shallowly than said sixth region.

7. A method for manufacturing an integrated semiconductor device comprising the steps of:

a. selectively diffusing a first conductivity type impurity in a major surface of a semiconductor body of a second conductivity type opposite to the first conductivity type to form a first heavily doped collector region of the first conductivity type;

b. epitaxially depositing a semiconductor material of the second conductivity type having a relatively high resistivity on the whole major surface of said body to form an epitaxial semiconductor layer thereon, whereby said first collector region is buried thereunder;

c. selectively diffusing an impurity determining the first conductlvity type into said epitaxial semiconductor layer to form a second diffused region of the first conductivity type extending to said first region and surrounding a first portion of said epitaxial layer above said first region, whereby said first portion of said epitaxial layer is electrically isolated from the other portion thereof;

d. diffusing an impurity determining the second conductivity type into said first portion of said epitaxial layer to form a base region of the second conductivity type having a relatively low resistivity;

e. selectively diffusing an impurity determining the first conductivity type into said diffused base region at a predetermined temperature and for a predetermined time enough to form a heavily doped emitter region of the first conductivity type within said diffused base region and spaced from said collector region with a distance shorter than the diffusion length of the minority carriers in said epitaxial layer; and f. forming an emitter, a base and a collector electrode connected to said emitter region, said base region and said diffused region, respectively.

* * * * *

UNITED STATES PATENT OFFICE

CERTIFICATE OF CORRECTION

Patent No. 3,735,481 Dated May 29, 1973

Inventor(s) Tsugio MAKIMOTO

It is certified that error appears in the above-identified patent and that said Letters Patent are hereby corrected as shown below:

Title Page, insert the following:

[30] Foreign Application Priority Data

August 16, 1967 Japan 52220/67
claim filed in parent application Serial No. 752,049
filed August 12, 1968.

Signed and Sealed this

Sixth Day of July 1976

[SEAL]

*Attest:*

RUTH C. MASON
*Attesting Officer*

C. MARSHALL DANN
*Commissioner of Patents and Trademarks*